United States Patent
Shin et al.

(10) Patent No.: US 10,476,013 B2
(45) Date of Patent: Nov. 12, 2019

(54) ELECTRONIC APPARATUS

(71) Applicant: Samsung Display Co., Ltd., Yongin-si (KR)

(72) Inventors: Jaiku Shin, Hwaseong-si (KR); Hansun Ryou, Seoul (KR); Mansik Myeong, Seoul (KR); Soyoun Jung, Seoul (KR); Sungchul Choi, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/287,985

(22) Filed: Feb. 27, 2019

(65) Prior Publication Data

US 2019/0273212 A1 Sep. 5, 2019

(30) Foreign Application Priority Data

Mar. 5, 2018 (KR) .......................... 10-2018-0025927

(51) Int. Cl.
  *H01L 51/00* (2006.01)
  *G02F 1/1333* (2006.01)
(52) U.S. Cl.
  CPC .... *H01L 51/0097* (2013.01); *G02F 1/133305* (2013.01)
(58) Field of Classification Search
  CPC ............. H01L 51/0096; H01L 51/5237; H01L 51/0097; H01L 2251/5338; G02F 1/133305
  See application file for complete search history.

(56) References Cited

U.S. PATENT DOCUMENTS

| | | | | |
|---|---|---|---|---|
| 8,194,399 | B2* | 6/2012 | Ashcraft | G06F 1/1626 |
| | | | | 257/59 |
| 10,074,701 | B2 | 9/2018 | Jeong et al. | |
| 10,147,772 | B2* | 12/2018 | Breedlove | G06F 1/1652 |
| 2013/0034685 | A1* | 2/2013 | An | H01L 51/524 |
| | | | | 428/121 |

(Continued)

FOREIGN PATENT DOCUMENTS

| | | |
|---|---|---|
| KR | 10-2015-0088101 | 7/2015 |
| KR | 10-2017-0066764 | 6/2017 |

(Continued)

*Primary Examiner* — Joseph L Williams
*Assistant Examiner* — Jose M Diaz
(74) *Attorney, Agent, or Firm* — H.C. Park & Associates, PLC

(57) ABSTRACT

An electronic apparatus includes a display panel having a display element and being configured to be folded or unfolded about a folding axis extending in a first direction, a window member disposed on the display panel, a first optical member disposed between the display panel and the window member, and a plurality of adhesive members disposed between the display panel and the window member. The adhesive members include a first adhesive member disposed on a surface of the display panel and having a first thickness and a second adhesive member disposed on a surface of the first optical member. The first thickness exceeds about 20% of a thickness of an adhesive member having a maximum thickness of the plurality of adhesive members, and the second thickness is smaller than about 125 micrometers.

20 Claims, 8 Drawing Sheets

(56) References Cited

U.S. PATENT DOCUMENTS

| | | | |
|---|---|---|---|
| 2014/0226275 A1* | 8/2014 | Ko | G06F 1/1626 |
| | | | 361/679.27 |
| 2015/0201487 A1 | 7/2015 | Kee et al. | |
| 2015/0268697 A1* | 9/2015 | Nam | G06F 1/1652 |
| | | | 428/157 |
| 2017/0162823 A1 | 6/2017 | Kim et al. | |
| 2017/0200915 A1* | 7/2017 | Lee | G02B 5/3033 |
| 2017/0278899 A1 | 9/2017 | Yang et al. | |
| 2017/0317315 A1* | 11/2017 | Yang | H01L 27/322 |
| 2017/0357289 A1* | 12/2017 | Ahn | H04M 1/0268 |
| 2018/0033834 A1* | 2/2018 | Jun | G06F 3/0412 |
| 2018/0081219 A1* | 3/2018 | Kim | G02F 1/133305 |
| 2018/0097197 A1* | 4/2018 | Han | G06F 1/1626 |
| 2019/0042042 A1* | 2/2019 | Hei | G06F 3/0412 |
| 2019/0044078 A1* | 2/2019 | Chen | H01L 51/0097 |

FOREIGN PATENT DOCUMENTS

| | | |
|---|---|---|
| KR | 10-2015-0084260 | 7/2017 |
| KR | 10-2017-0084402 | 7/2017 |
| KR | 10-2017-0113822 | 10/2017 |

* cited by examiner

ELECTRONIC APPARATUS

CROSS-REFERENCE TO RELATED APPLICATION

This application claims priority from and the benefit of Korean Patent Application No. 10-2018-0025927, filed on Mar. 5, 2018, which is hereby incorporated by reference for all purposes as if fully set forth herein.

BACKGROUND

Field

Exemplary implementations of the invention relate generally to an electronic apparatus and, more specifically, to a foldable electronic apparatus having improved reliability.

Discussion of the Background

In recent years, a bendable or foldable electronic apparatus has been actively developed. The flexible electronic apparatus includes an electronic panel, such as a flexible display panel or a flexible touch panel, and various external members. The external members have different functions. The external members are disposed on at least one of the opposed surfaces of the electronic apparatus. The external members are curved, bent, or folded with the electronic apparatus.

In order to curve, bend, or fold the external members, the external members are required to have flexibility. When the external members have the flexibility, reliability of the external members against stress due to the bending is improved, but reliability of the external members against external impacts is reduced.

The above information disclosed in this Background section is only for understanding of the background of the inventive concepts, and, therefore, it may contain information that does not constitute prior art.

SUMMARY

Electronic apparatus including display devices constructed according to exemplary implementations of the invention have improved impact resistance and improved flexibility due to the adhesive members disposed between the layers of the electronic apparatus having thicknesses within predetermined ranges. For example, particularly advantageous and surprising results were achieved when the thickness of one adhesive member exceeds about 20% of the thickness of the thickest adhesive member and the thickness of another adhesive member is smaller than about 125 micrometers.

Thus electronic apparatus constructed according to exemplary implementations of the invention have a stacked structure with a suitable balance of flexibility and rigidity. Accordingly, the stress caused by folding the electronic apparatus may be relieved, and the impact resistance of the electronic apparatus may be improved Additional features of the inventive concepts will be set forth in the description which follows, and in part will be apparent from the description, or may be learned by practice of the inventive concepts.

According to one aspect of the invention, an electronic apparatus includes a display panel having a display element and being configured to be folded or unfolded about a folding axis extending in a first direction, a window member disposed on the display panel and configured to be folded or unfolded about the folding axis, a first optical member disposed between the display panel and the window member, and a plurality of adhesive members disposed between the display panel and the window member. The adhesive members include a first adhesive member disposed on a surface of the display panel and having a first thickness and a second adhesive member disposed on a surface of the first optical member and having a second thickness. The first thickness exceeds about 20% of a thickness of an adhesive member having a maximum thickness of the plurality of adhesive members, and the second thickness is smaller than about 125 micrometers.

The window member may include a glass substrate.

The window member may have a thickness smaller than about 100 micrometers.

The window member may include a resin film.

The first thickness may be smaller than about 65 micrometers.

The first adhesive member may be disposed between the display panel and the first optical member and attached to each of the display panel and the first optical member, and the second adhesive member may be attached to an upper surface of the first optical member.

The electronic apparatus may further include a second optical member disposed between the first optical member and the window member, and the plurality of adhesive members may further include a third adhesive member disposed between the additional optical member and the window member.

The window member may be more adjacent to the folding axis than the display panel is to enable the apparatus to be inwardly folded.

The electronic apparatus may further include a base member disposed under the display panel and a lower adhesive member disposed between the base member and the display panel, and the base member may include an organic material.

The electronic apparatus may further include a lower protection member disposed under the base member and an upper protection member disposed on the window member.

The upper protection member may directly make contact with the window member.

The electronic apparatus may further include an upper adhesive member disposed between the upper protection member and the window member, and the upper adhesive member may directly make contact with the upper protection member and the window member.

The display panel may further include a touch sensor disposed on the display element to sense an external input, and the first adhesive member may be disposed on the touch sensor.

According to another aspect of the invention, an electronic apparatus includes a window member configured to be folded or unfolded about a folding axis extending in a first direction, a display panel configured to be folded or unfolded about the folding axis and to display an image through the window member, a first optical member disposed between the display panel and the window member, and a plurality of adhesive members disposed between the display panel and the window member. The adhesive members include a first adhesive member disposed between the display panel and the first optical member and attached to the first optical member and a second adhesive member disposed between the first optical member and the window member and attached to the first optical member. The first adhesive member has a thickness exceeding about 20% of a thickness of an adhesive member having a maximum thickness of the plurality of adhesive members, and the second adhesive member has a thickness smaller than about 125 micrometers.

The first optical member may include at least one of an optical member, a light compensation film, and a phase difference film.

The first optical member may include a plurality of layers, and a layer making contact with the first adhesive member may be different from a layer making contact with the second adhesive member.

The first optical member may include a transparent plate with an integral shape, the first adhesive member may make contact with a lower surface of the transparent plate, and the second adhesive member may make contact with an upper surface of the transparent plate.

The window member may be relatively adjacent to the folding axis than the display panel is to enable the apparatus to be inwardly folded.

The window member may have a modulus from about 60 GPa to about 75 GPa and a thickness smaller than about 100 micrometers.

The electronic apparatus may further include a second optical member disposed between the first optical member and the window member, the adhesive members further include a third adhesive member disposed between the second optical member and the window member, and the maximum thickness of the plurality of adhesive members corresponds to a maximum value of thicknesses of the first, second, and third adhesive members.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

The above and other advantages of the exemplary embodiments will become readily apparent by reference to the following detailed description when considered in conjunction with the accompanying drawings wherein.

DETAILED DESCRIPTION

Figure 1A:
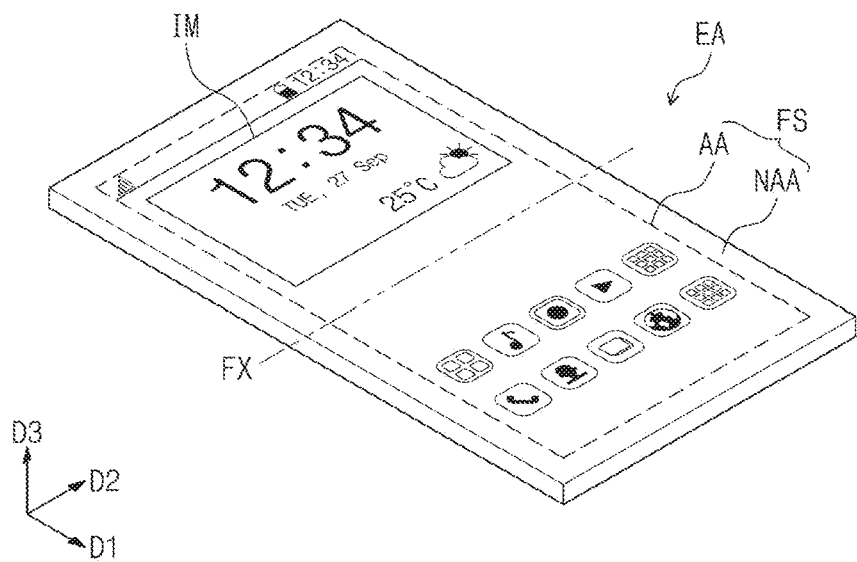
FIGS. 1A and 1B are perspective views of an exemplary embodiment of an electronic apparatus constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments of the invention will be explained in detail with reference to the accompanying drawings.

Figure 1B:
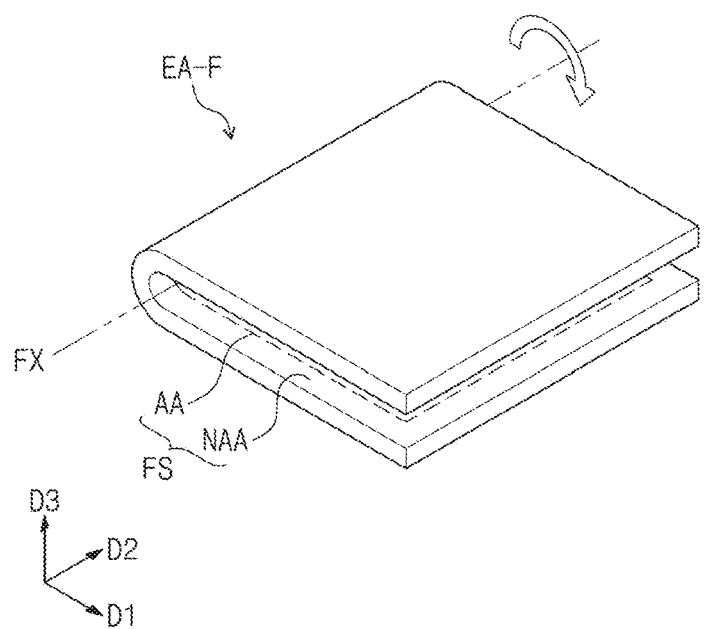

FIGS. 1A and 1B are perspective views of an exemplary embodiment of an electronic apparatus constructed according to the principles of the invention. As shown in FIGS. 1A and 1B, the electronic apparatus EA may have a variety of shapes. FIG. 1A is the perspective view showing the electronic apparatus EA in a first state, and FIG. 1B is the perspective view showing the electronic apparatus EA-F in a second state. Hereinafter, the electronic apparatus EA according to the exemplary embodiment will be described with reference to FIGS. 1A and 1B.

The electronic apparatus EA is driven in response to an electrical signal applied thereto. The electronic apparatus EA may be provided in various forms, such as a touch sensing apparatus, a display apparatus, a touch screen apparatus, etc., and should not be limited to a specific embodiment. For the convenience of explanation, as a representative example of the exemplary embodiment, the display apparatus will be described as the electronic apparatus EA.

The electronic apparatus EA may be deformed in a variety of shapes depending on external forces. The electronic apparatus EA may be in an unfolded state, a rolled state forming a predetermined curved surface, or a partially folded state depending on the external forces applied thereto. FIGS. 1A and 1B show different shapes depending on the external forces.

As shown in FIG. 1A, the first state may be a substantially flat or unfolded state. The electronic apparatus EA in the first state (hereinafter, referred to as "electronic apparatus EA") may display an image IM through a front surface FS. The front surface FS may be substantially parallel to a first direction D1 and a second direction D2 and perpendicular to a third direction D3. The front surface FS may include an active area AA and a peripheral area NAA.

The active area AA may be an area through which the image IM is displayed in response to an electrical signal. The peripheral area NAA is disposed adjacent to the active area AA. The peripheral area NAA does not display the image IM. The active area AA may have a shape determined by the peripheral area NAA when viewed in a plan view.

As shown in FIG. 1B, the second state may be the folded state. The electronic apparatus EA in the second state (hereinafter, referred to as "folded electronic apparatus EA-F") may be folded about a folding axis FX. The folding axis FX may be defined at various positions. In the illustrated exemplary embodiment, the folding axis FX is defined on the front surface FS and extends in the second direction D2, but it should not be limited thereto or thereby. That is, the folding axis FX may be defined under the front surface FS or may extend in an oblique direction with respect to the first direction D1 or the second direction D2. The electronic apparatus EA may be folded or unfolded along the folding axis FX defined therein and should not be limited to a specific embodiment.

In the illustrated exemplary embodiments, the electronic apparatus EA is folded inwardly in a direction to wrap around the folding axis FX. Accordingly, the folded electronic apparatus EA-F may have a shape covering the active area AA. The electronic apparatus EA provides a user with information through the active area AA in the unfolded state and stably protects the active area AA in the folded state.

Figure 2A:
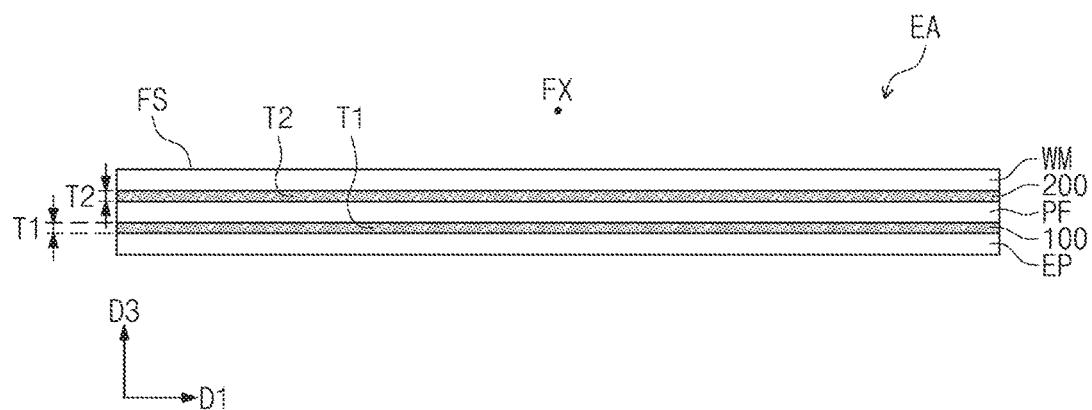
FIGS. 2A and 2B are cross-sectional views of an exemplary embodiment of an electronic apparatus constructed according to the principles of the invention.
Figure 2B:
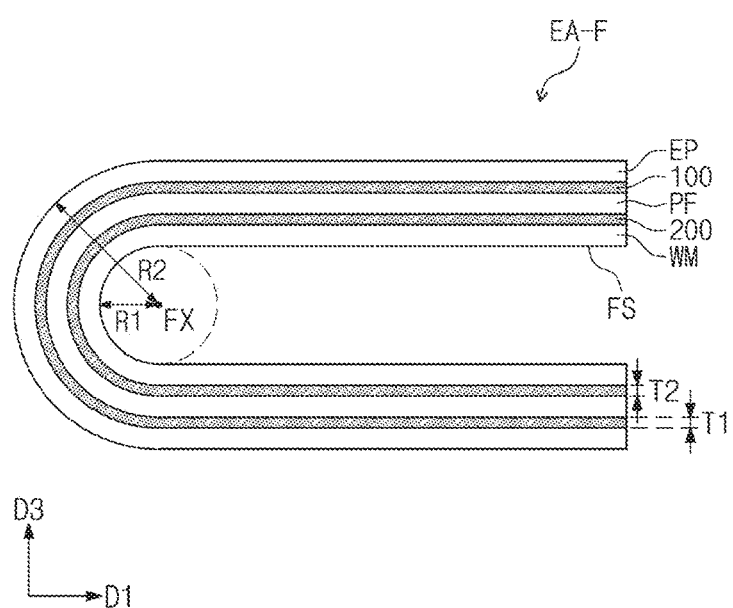
Figure 3A:
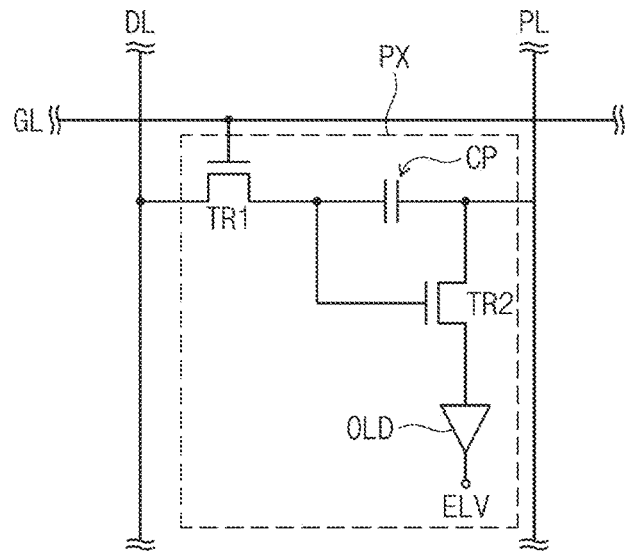
FIG. 3A is an equivalent circuit diagram showing some components of the electronic apparatus shown in FIG. 2A.
Figure 3B:
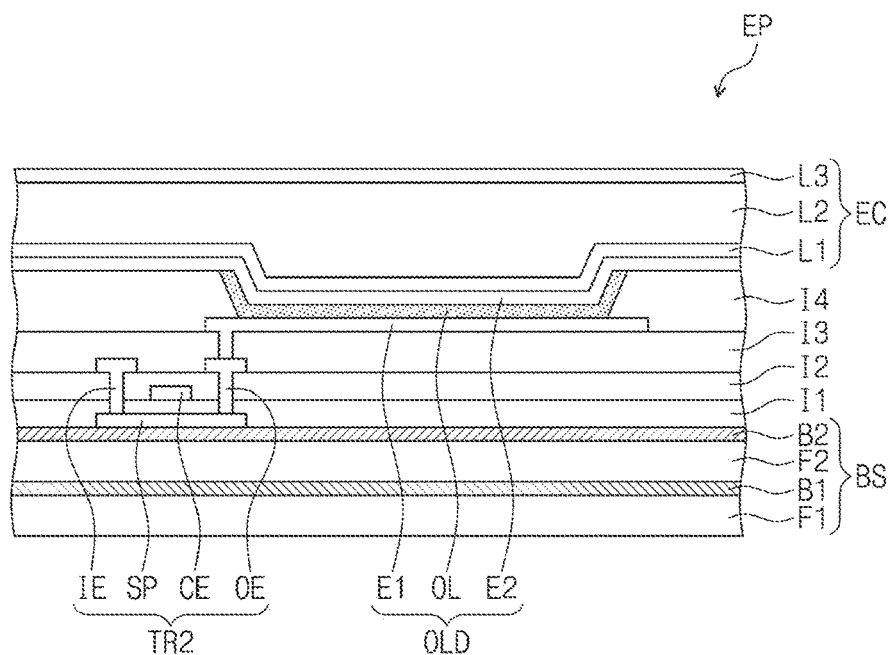
FIG. 3B is a cross-sectional view showing some components of the electronic apparatus shown in FIG. 2A.

FIGS. 2A and 2B are cross-sectional views of an exemplary embodiment of an electronic apparatus constructed according to the principles of the invention. FIG. 3A is an equivalent circuit diagram showing some components of the electronic apparatus shown in FIG. 2A, and FIG. 3B is a cross-sectional view showing some components of the electronic apparatus shown in FIG. 2A.

FIG. 2A is the cross-sectional view showing the electronic apparatus EA in the unfolded state as shown in FIG. 1A, and FIG. 2B is the cross-sectional view showing the electronic apparatus EA-F in the folded state as shown in FIG. 1B. Hereinafter, the electronic apparatus EA and EA-F will be described in detail with reference to FIGS. 2A and 2B.

Referring to FIGS. 2A and 2B, the electronic apparatus EA and EA-F includes an electronic panel EP, a window member WM, a first optical member PF, and a plurality of adhesive members 100 and 200. The adhesive members 100 and 200 include a first adhesive member 100 and a second adhesive member 200.

The electronic panel EP has flexibility. Accordingly, the electronic panel EP may be folded or unfolded about the folding axis FX. The electronic panel EP may include a display panel displaying an image, a sensing panel sensing an external input, or a combination thereof. In the illustrated exemplary embodiments, the electronic panel EP includes a display panel. Accordingly, the electronic panel EP displays the image IM (refer to FIG. 1A). The display panel may be a liquid crystal display panel, an organic light emitting display panel, an electrophoretic display panel, an electrowetting display panel, or other type of display panel known in the art.

The electronic panel EP may include a plurality of pixels. Each of the pixels may generate a light to display the image IM. For the convenience of explanation, FIG. 3A shows the equivalent circuit diagram of a representative pixel PX.

Referring to FIG. 3A, the pixel PX is electrically connected to a plurality of signal lines. As an example, the pixel PX receives a gate signal through a gate line GL and a data signal through a data line DL. In addition, the pixel PX receives a first power voltage through a power line PL. The pixel PX includes a first transistor TR1, a second transistor TR2, a capacitor CP, and a light emitting device OLD.

The first transistor TR1 outputs the data signal applied thereto through the data line DL in response to the gate signal applied thereto through the gate line GL. The first transistor TR1 may serve as a switching device of the pixel PX. The capacitor CP is charged with an amount of electric charge corresponding to a voltage difference between the signal provided through the first transistor TR1 and a power signal provided through the power line PL.

The second transistor TR2 is connected to the light emitting device OLD. The second transistor TR2 controls a driving current flowing through the light emitting device OLD in response to the electric charge amount charged in the capacitor Cap.

The light emitting device OLD emits the light in accordance with the electrical signal. The light emitting device OLD may be an organic light emitting device OLED including an organic light emitting layer or a quantum dot light emitting device QD-LED including a quantum dot. The light emitting device OLD emits the light during a turn-on period of the second transistor TR2.

FIG. 3B shows the cross-section of the electronic panel EP corresponding to an area in which the second transistor TR2 and the light emitting device OLD are arranged in the equivalent circuit diagram shown in FIG. 3A. In the illustrated exemplary embodiments, the organic light emitting device will be described as the light emitting device OLD.

Referring to FIG. 3B, the electronic panel EP includes a base substrate BS, the second transistor TR2, the light emitting device OLD, a plurality of insulating layers I1, I2, I3, and I4, and an encapsulation layer EC.

The base substrate BS may be flexible and may have an insulating property. Accordingly, the base substrate BS may be easily folded or unfolded about the folding axis FX. Meanwhile, in the illustrated exemplary embodiments, the base substrate BS may include a plurality of layers stacked in the third direction D3. As an example, the base substrate BS may include a first film layer F1, a first barrier layer B1, a second film layer F2, and a second barrier layer B2.

The first film layer F1 and the second film layer F2 may include an organic material. For example, each of the first film layer F1 and the second film layer F2 may include a resin such as polyimide (PI). The first film layer F1 and the second film layer F2 may include the same material as each other or different materials from each other.

The first barrier layer B1 and the second barrier layer B2 may include an inorganic material. The first barrier layer B1 and the second barrier layer B2 may be alternately arranged with the first film layer F1 and the second film layer F2. Accordingly, the first barrier layer B1 and the second barrier layer B2 may block humidity infiltrating into the pixel PX through the first film layer F1 and the second film layer F2 and improve an adhesive force between the pixel PX and the base substrate BS. Meanwhile, the first barrier layer B1 and the second barrier layer B2 may be omitted from the base substrate BS according to an exemplary embodiment of the invention, and the base substrate BS may include only one of the first film layer F1 and the second film layer F2. However, the base substrate BS should not be limited thereto or thereby.

The second thin film transistor TR2 is disposed on the base substrate BS. The second thin film transistor TR2 includes a semiconductor pattern SP, a control electrode CE, an input electrode IE, and an output electrode OE.

The semiconductor pattern SP is disposed between the base substrate BS and the first insulating layer 11. The first insulating layer 11 is disposed on the base substrate BS to cover the semiconductor pattern SP. The first insulating layer I1 includes an organic layer and/or an inorganic layer. The first insulating layer I1 may include a plurality of thin film layers.

The control electrode CE is connected to the first thin film transistor TR1 and the capacitor CP. The control electrode CE is disposed between the first insulating layer I1 and the second insulating layer I2. The control electrode CE overlaps with and is spaced apart from the semiconductor pattern SP when viewed in a plan view. The second insulating layer I2 is disposed on the first insulating layer I1 to cover the control electrode CE. The second insulating layer I2 includes an organic layer and/or an inorganic layer. The second insulating layer I2 may include a plurality of thin film layers.

The input electrode IE and the output electrode OE are disposed on the second insulating layer I2 and spaced apart from each other. The input electrode IE is connected to the capacitor CP, and the output electrode OE is connected to the light emitting device OLD. The input electrode IE and the output electrode OE are respectively connected to one side and the other side of the semiconductor pattern SP after passing through the first insulating layer I1 and the second insulating layer I2.

The light emitting device OLD is disposed on the third insulating layer I3. The third insulating layer I3 is disposed on the second insulating layer I2 to cover the input electrode IE and the output electrode OE of the second thin film transistor TR2. The third insulating layer I3 includes an organic layer and/or an inorganic layer. The third insulating layer I3 may include a plurality of thin film layers.

The light emitting device OLD includes a first electrode E1, a light emitting layer OL, and a second electrode E2. The light emitting device OLD excites electrons of the light emitting layer OL using a difference in electric potential between the first electrode E1 and the second electrode E2 to generate a light.

The first electrode E1 is disposed on the third insulating layer I3. The first electrode E1 is connected to the second thin film transistor TR2 through the third insulating layer I3. The first electrode E1 receives a voltage corresponding to the data signal from the second thin film transistor TR2.

The light emitting layer OL is disposed on the first electrode E1 and disposed in an opening defined in the fourth insulating layer I4. The fourth insulating layer I4 is disposed on the third insulating layer I3 and provided with the opening defined therethrough to expose at least a portion of the first electrode E1. The fourth insulating layer I4 includes an organic layer and/or an inorganic layer. The fourth insulating layer I4 may include a plurality of thin film layers The second electrode E2 is disposed on the light emitting layer OL. The second electrode E2 covers the fourth insulating layer I4 and the light emitting layer OL. The second electrode E2 is connected to a power terminal ELV to receive a second power voltage different from the first power voltage.

At least one organic layer and/or an inorganic layer may be further disposed between the first electrode E1 and the light emitting layer OL and between the second electrode E2 and the light emitting layer OL. In addition, the light emitting layer OL may be provided in plural portions spaced apart from each other. The light emitting device OLD may be provided in various embodiments and should not be limited to a specific embodiment.

The encapsulation layer EC is disposed on the second electrode E2. The encapsulation layer EC may include a plurality of thin film layers stacked in the third direction D3. As an example, the encapsulation layer EC includes a first layer L1, a second layer L2, and a third layer L3.

The first layer L1 is disposed on the second electrode E2 to cover the second electrode E2. The first layer L1 may include an inorganic material. The first layer L1 protects the second electrode E2 from external humidity or air. The second layer L2 is disposed on the first layer L1. The second layer L2 may have a thickness relatively thicker than that of the first layer L1. The second layer L2 may include an organic material. The second layer L2 planarizes an upper surface of the first layer L1 to provide a flat surface.

The third layer L3 is disposed on the second layer L2 to cover the second layer L2. The third layer L3 encapsulates the second layer L2. The electronic panel EP according to the exemplary embodiment may include a variety of components depending on its type and should not be limited to a specific embodiment.

Referring to FIG. 2A again, the window member WM is disposed on the electronic panel EP. An upper surface of the window member WM defines the front surface FS of the electronic apparatus EA. The window member WM is disposed on a display surface of the electronic panel EP. The window member WM may be optically transparent. Accordingly, the image IM generated by the electronic panel EP may be easily recognized by the user through the window member WM.

The window member WM has the flexibility. Accordingly, the window member WM may be folded or unfolded about the folding axis FX. For example, the window member WM may be a resin film including an organic material.

According to the exemplary embodiments, although the window member WM is formed of a material having a relatively high modulus, the window member WM may have both sufficient rigidity and flexibility by controlling a thickness of the window member WM. As an example, when the window member WM is a glass substrate having the modulus equal to or greater than about 50 GPa and equal to or smaller than about 75 GPa at room temperature (about 25° C.), the window member WM may have the thickness equal to or smaller than about 100 micrometers (μm). Accordingly, the window member WM may stably protect the components included in the electronic apparatus EA and have the flexibility.

The first optical member PF is disposed between the electronic panel EP and the window member WM. The first optical member PF may be optically transparent. Accordingly, the image IM generated by the electronic panel EP may be displayed on the front surface FS of the electronic apparatus EA after passing through the first optical member PF.

The first optical member PF may block an external light from reflecting. The first optical member PF may prevent components included in the electronic panel EP from being visible from the outside of the electronic panel EP due to the external light incident through the front surface FS of the electronic apparatus EA. As another example, the first optical member PF may be a color filter including a black matrix, an optical filter improving an optical characteristic, or a transparent plate such as a transparent filter. In the illustrated exemplary embodiments, a polarizing film will be described as the first optical member PF.

The first adhesive member 100 is disposed between the first optical member PF and the electronic panel EP and makes contact with a lower surface of the first optical member PF. In the illustrated exemplary embodiments, the first adhesive member 100 may be attached to each of the electronic panel EP and the first optical member PF.

The first adhesive member 100 may be optically transparent. The first adhesive member 100 may be an adhesive layer manufactured by coating and curing a liquid adhesive material or an adhesive sheet separately manufactured. As an example, the first adhesive member 100 may be a pressure sensitive adhesive (PSA), an optical clear adhesive (OCA), or an optical clear resin (OCR).

The second adhesive member 200 is disposed between the window member WM and the first optical member PF and makes contact with an upper surface of the first optical member PF. In the illustrated exemplary embodiments, the second adhesive member 200 may be attached to each of the window member WM and the first optical member PF.

The second adhesive member 200 may be optically transparent. The second adhesive member 200 may be an adhesive layer manufactured by coating and curing a liquid adhesive material or an adhesive sheet separately manufactured. As an example, the second adhesive member 200 may be a pressure sensitive adhesive (PSA), an optical clear adhesive (OCA), or an optical clear resin (OCR).

Referring to FIGS. 2A and 2B, the folded electronic apparatus EA-F may be folded inwardly to wrap around the folding axis FX. Each component of the electronic apparatus EA is folded about the folding axis FX. The window member WM nearest to the folding axis FX may be folded inwardly at a first curvature radius R1. The first curvature radius R1 may be defined by a distance from a front surface of the window member WM to the folding axis FX.

The electronic panel EP farthest away from the folding axis FX may be folded inwardly at a second curvature radius R2. The second curvature radius R2 may be defined by a distance from a rear surface of the electronic panel EP to the folding axis FX.

In the illustrated exemplary embodiments, the folding axis FX is defined on the front surface of the window member WM. Accordingly, the second curvature radius R2 may be greater than the first curvature radius R1, and the device is folded inwardly to protect the display. The first curvature radius R1 and the second curvature radius R2 may be equal to or smaller than about 2 mm. The electronic apparatus EA according to the illustrated exemplary embodiment may be stably folded even under a minute curvature radius.

FIGS. 2A and 2B show a thickness T1 (hereinafter, referred to as "first thickness") of the first adhesive member 100 and a thickness T2 (hereinafter, referred to as "second thickness") of the second adhesive member 200. In the illustrated exemplary embodiments, the first adhesive member 100 may be designed to have a thickness greater than about 0.2 times a thickness of an adhesive member having the greatest thickness among adhesive members disposed between the electronic panel EP and the window member WM. Accordingly, the first thickness T1 may be in a range greater than about 0.2 times the greatest value between the first thickness T1 and the second thickness T2.

In addition, in the illustrated exemplary embodiments, the second adhesive member 200 may be designed to have a thickness smaller than about 125 micrometers (μm). Accordingly, the second thickness T2 may be in a range smaller than about 125 micrometers (μm).

The electronic apparatus EA may control the thicknesses of the adhesive members disposed above/under the first optical member PF, and thus the electronic apparatus EA may have improved rigidity against a folding stress and improved impact resistance against the external impacts. These will be described in detail later.

Figure 4:
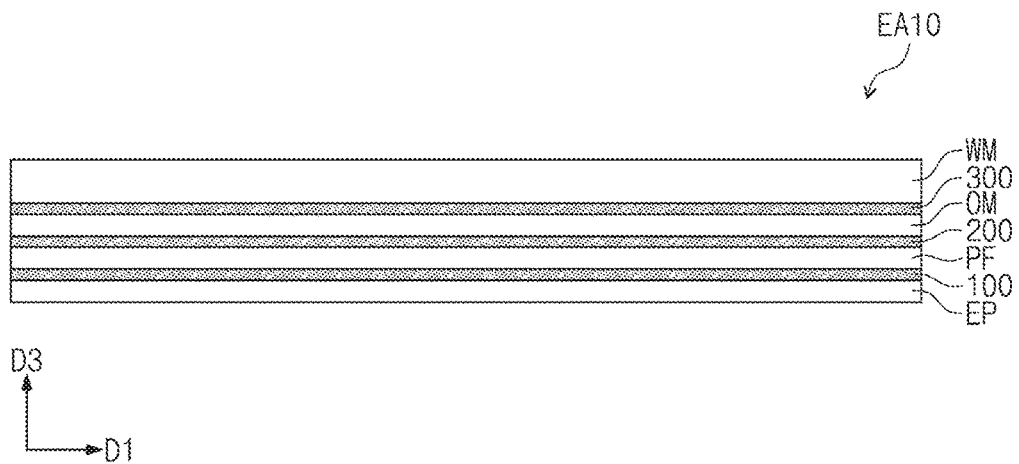
FIG. 4 is a cross-sectional view of another exemplary embodiment of an electronic apparatus constructed according to the principles of the invention.

FIG. 4 is a cross-sectional view of another exemplary embodiment of an electronic apparatus constructed according to the principles of the invention. As shown in FIG. 4, the electronic apparatus EA10 may further include a second optical member OM and a third adhesive member 300.

The second optical member OM may be disposed between the first optical member PF and the window member WM. The second optical member OM may be optically transparent. The second optical member OM may include a phase difference film or a compensation film.

The third adhesive member 300 is disposed between the second optical member OM and the window member WM. The third adhesive member 300 is attached to each of the second optical member OM and the window member WM to physically couple the second optical member OM and the window member WM.

The third adhesive member 300 may be optically transparent. The third adhesive member 300 may be an adhesive layer manufactured by coating and curing a liquid adhesive material or an adhesive sheet separately manufactured. As an example, the third adhesive member 300 may be a pressure sensitive adhesive (PSA), an optical clear adhesive (OCA), or an optical clear resin (OCR).

In the electronic apparatus EA10 according to the illustrated exemplary embodiments, the adhesive members disposed between the window member WM and the electronic panel EP may include the first, second, and third adhesive members 100, 200, and 300. Accordingly, the thickness of the first adhesive member 100 may be controlled to exceed about 20% of the thickness of the adhesive member having the greatest thickness between the first, second, and third adhesive members 100, 200, and 300. In addition, the thickness of the second adhesive member 200 may be controlled not to exceed about 125 micrometers (μm).

According to the exemplary embodiments, even though the number of the adhesive members disposed between the window member WM and the electronic panel EP is changed, the reliability of the electronic apparatus EA10 in the second state may be improved by controlling the thickness of the first adhesive member with respect to the greatest thickness of the adhesive members disposed between the window member WM and the electronic panel EP and controlling a higher limit (e.g., about 125 micrometer) of the thickness of the second adhesive member. These will be described in detail later.

Figure 5A:
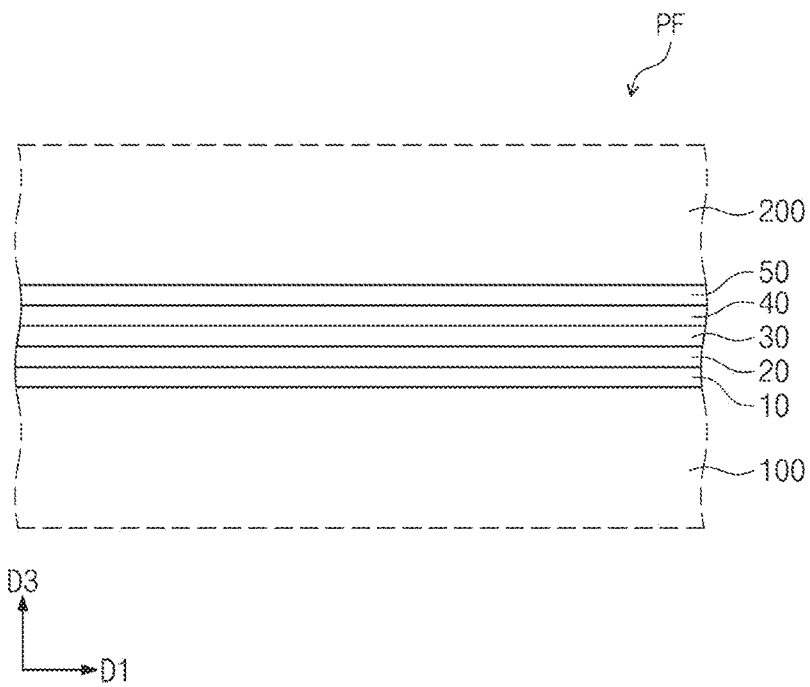
FIG. 5A is a cross-sectional view of a first optical member constructed according to an exemplary embodiment.
Figure 5B:
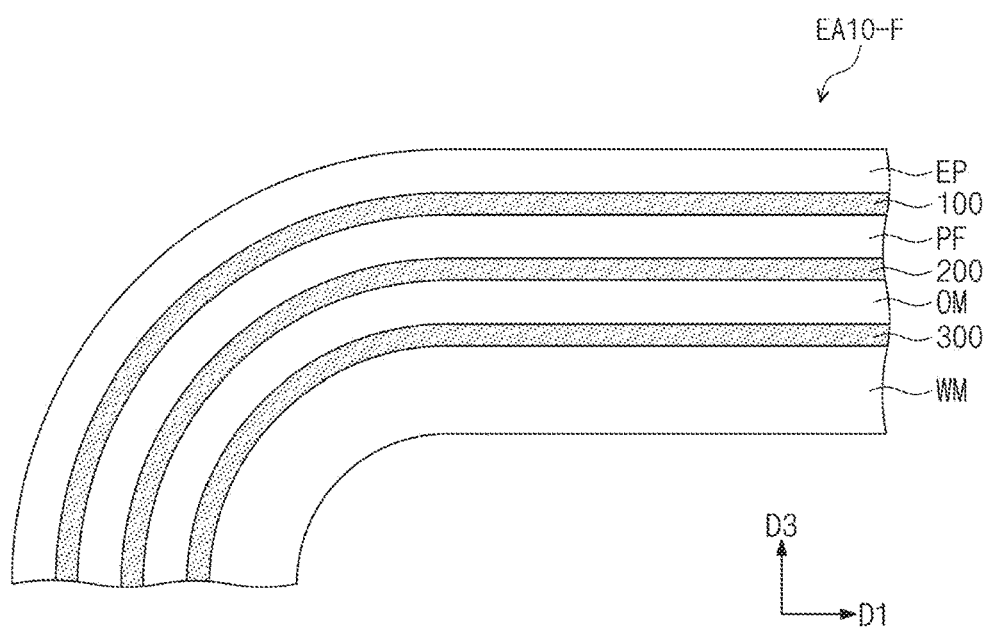
FIG. 5B is cross-sectional view showing a portion of an electronic apparatus constructed according to an exemplary embodiment.
Figure 5C:
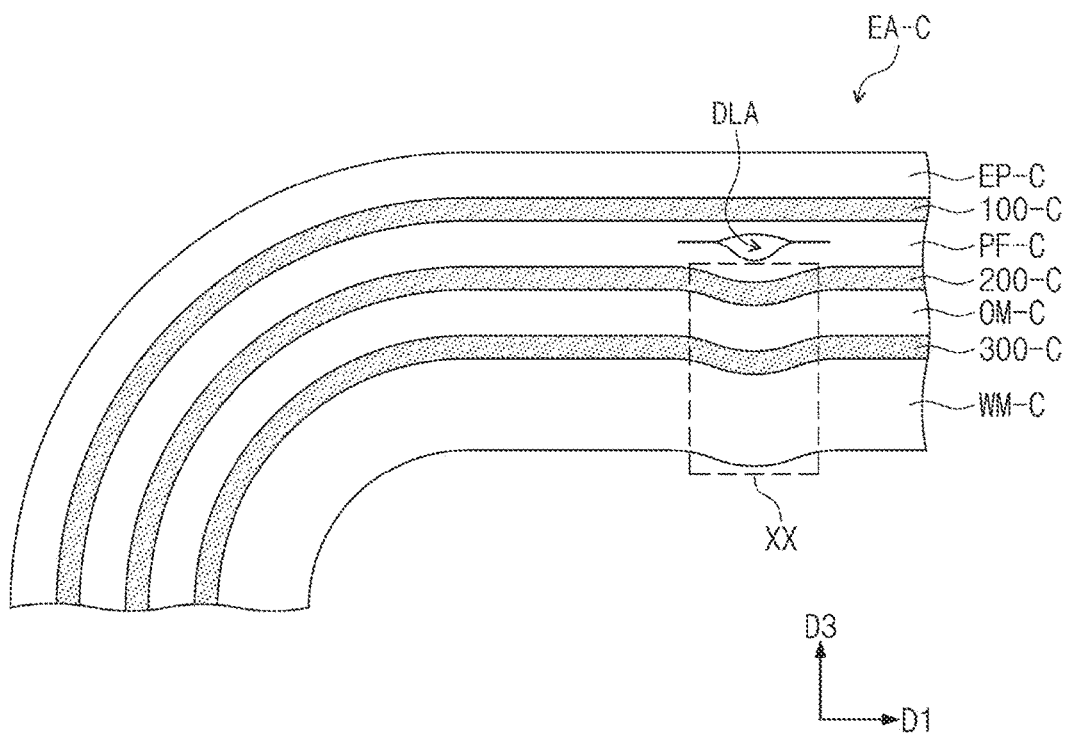
FIG. 5C is a cross-sectional view showing a portion of an electronic apparatus constructed according to a comparison example.

FIG. 5A is a cross-sectional view of a first optical member constructed according to an exemplary embodiment. FIG. 5B is cross-sectional view showing a portion of an electronic apparatus constructed according to an exemplary embodiment. FIG. 5C is a cross-sectional view showing a portion of an electronic apparatus constructed according to a comparison example. For the convenience of explanation, portions, which make contact with the optical member, of the first adhesive member 100 and the second adhesive member 200 are represented by a dashed line in FIG. 5A, a portion of a folded electronic apparatus EA10-F obtained by folding the electronic apparatus EA10 shown in FIG. 4 is represented enlarged in FIG. 5B, and a cross-sectional view of an electronic apparatus EA-C according to the comparison example in an area corresponding to that of FIG. 5B is shown in FIG. 5C. The electronic apparatus EA-C of the comparison example has the same structure and function as those of the electronic apparatus EA except for adhesive members having different thicknesses from those of the first adhesive member 100 and the second adhesive member 200 of the exemplary embodiments.

As described above, the first optical member PF prevents the external light, which is incident to the front surface of the electronic apparatus EA10 from the outside of the electronic apparatus EA10, from reflecting on the electronic apparatus EA10 while the electronic apparatus EA10 is unfolded. As shown in FIG. 5A, the first optical member PF may include a plurality of layers. The first optical member PF may include a first protection layer 10, a first adhesive layer 20, a polarization layer 30, a second adhesive layer 40, and a second protection layer 50.

The first protection layer 10 defines the lower surface of the first optical member PF. The first protection layer 10 may make contact with the first adhesive member 100. The first protection layer 10 may protect and support the polarization layer 30. The first adhesive layer 20 is disposed on the first protection layer 10. The first adhesive layer 20 couples the polarization layer 30 to the first protection layer 10. The first adhesive layer 20 is not included in the adhesive members disposed between the electronic panel EP (refer to FIG. 2A and/or FIG. 4) and the window member WM (refer to FIG. 2A and/or FIG. 4).

The polarization layer 30 includes a polarizer. The polarization layer 30 polarizes the light incident upon the first optical member PF. The second adhesive layer 40 is disposed on the polarization layer 30 to couple the polarization layer 30 to the second protection layer 50. The second adhesive layer 40 is not included in the adhesive members disposed between the electronic panel EP and the window member WM.

The second protection layer 50 defines the upper surface of the first optical member PF. The second protection layer 50 may make contact with the second adhesive member 200. The second protection layer 50 may protect and support the polarization layer 30.

Since the thicknesses of the adhesive members 100 and 200 are controlled, portions of the first optical member PF are prevented from separating or buckling to allow the electronic apparatus EA to be stably folded.

In detail, referring to FIG. 5B, the folded electronic apparatus EA10-F according to the embodiment of the exemplary embodiment includes the first adhesive member 100 having the first thickness T1 (refer to FIG. 2A) and the second adhesive member 200 having the second thickness T2 (refer to FIG. 2A). The first optical member PF of the folded electronic apparatus EA-F may be stably folded.

In contrast to the exemplary embodiments of the invention as discussed above, referring to FIG. 5C, the electronic apparatus EA-C according to the comparison example includes a first adhesive member 100-C and a second adhesive member 200-C, which have different thicknesses than those of the first and second adhesive members 100 and 200 of the exemplary embodiment. Accordingly, a defect DLA such as buckling or partial separation of an first optical member PF-C may occur in the electronic apparatus EA-C when the electronic apparatus EA-C is folded. Accordingly, an area in which defects such as wrinkles are generated appears in the second adhesive member 200-C and the window member WM-C, which are attached to the first optical member PF-C.

Meanwhile, the defect DLA may occur in a boundary between the first optical member PF-C and the first and second adhesive members 100-C and 200-C. The defect DLA caused by the deformation of the first optical member PF-C due to the folding stress may occur in various ways.

Table 1 shows whether the defect caused by the folding of electronic apparatuses occurs in first to sixth empirical embodiments in which adhesive layers have different thicknesses from each other. Each of the electronic apparatuses according to the first to sixth embodiments has a structure corresponding to that of the folded electronic apparatus EA10-F including the first, second, and third adhesive layers 100, 200, and 300 and is obtained by changing the thicknesses of the first, second, and third adhesive layers 100, 200, and 300, and the defect is determined based on whether the buckling occurs. Accordingly, Table 1 shows a thickness ADL1 of the first adhesive member, a thickness ADL2 of the second adhesive member, a thickness ADL3 of the third adhesive member, a maximum thickness value Max., and a percentage (ADL1/Max.) of the thickness of the first adhesive member to a maximum thickness. Hereinafter, the first to sixth empirical embodiments will be described with reference to Table 1.

TABLE 1

| Embodiment | 1 | 2 | 3 | 4 | 5 | 6 |
|---|---|---|---|---|---|---|
| ADL3 (μm) | 135 | 125 | 100 | 50 | 50 | 50 |
| ADL2 (μm) | 50 | 50 | 50 | 100 | 125 | 130 |
| ADL1 (μm) | 25 | 25 | 25 | 50 | 50 | 50 |
| Max. (μm) | 135 | 125 | 100 | 100 | 125 | 130 |
| ALD1/Max. (%) | 19 | 20 | 25 | 50 | 40 | 38 |
| Whether defect occurs | ○ | ○ | X | X | ○ | ○ |

Referring to the first to third embodiments of Table 1, the thickness ADL1 of the first adhesive member is maintained at about 25 micrometers (μm), the thickness ADL2 of the second adhesive member is maintained at about 50 micrometers (μm), and the thickness ADL3 of the third adhesive member is changed to allow the percentage of the thickness ADL1 of the first adhesive member to the maximum thickness value and the maximum thickness to be different. Referring to the first and second embodiments, since the third adhesive member is designed to have the thickness ADL3 of about 135 micrometers (μm) and about 125 micrometers (μm), the percentage of the thickness ADL1 of the first adhesive member to the maximum thickness among the thicknesses of the first, second, and third adhesive members is determined to about 19% and about 20%, which do not exceed about 20%. Accordingly, it was determined that the defect occurs in each of the first and second embodiments.

Different from the first and second embodiments, referring to the third embodiment, since the third adhesive member is designed to have the thickness ADL3 of about 100 micrometers (μm), the percentage of the thickness ADL1 of the first adhesive member to the maximum thickness is determined to about 25%, which exceeds about 20%. Accordingly, it was determined that the defect does not occur in the third embodiment. According to the exemplary embodiment, since the thickness of the first adhesive member 100 is designed to exceed about 20% of the maximum thickness among the thicknesses of the adhesive members disposed between the electronic panel EP and the window member WM, the electronic apparatus EA10 has improved reliability against the folding stress.

Referring to the fourth to sixth embodiments, the thickness ADL1 of the first adhesive member is maintained at about 50 micrometers (μm), the thickness ADL3 of the third adhesive member is maintained at about 50 micrometers (μm), and the thickness ADL2 of the second adhesive member is changed. Referring to the fourth to sixth embodiments, even though the thickness ADL2 of the second adhesive member is changed, the percentage of the thickness of the first adhesive member to the maximum thickness is determined to about 50%, about 40%, and about 38%, which exceed about 20%. That is, the fourth to sixth embodiments may correspond to embodiments that satisfy a limitation on the extent of the thickness ADL1 of the first adhesive member.

Referring to the fourth embodiment, the second adhesive member has the thickness of about 100 micrometers (μm) smaller than about 125 micrometers (μm). In this case, the defect does not occur in the electronic apparatus of the fourth embodiment even though the electronic apparatus according to the fourth embodiment is folded.

Referring to the fifth and sixth embodiments, the second adhesive member is designed to have the thickness ADL2 of about 125 micrometers (μm) and about 130 micrometers (μm), each of which is equal to or greater than about 125 micrometers (μm). The electronic apparatuses according to the fifth and sixth embodiments have the structure in which the percentage of the thickness of the first adhesive member to the maximum thickness exceeds about 20%, but the defect occurs in the electronic apparatuses of the fifth and sixth embodiments when the electronic apparatuses according to the fifth and sixth embodiments are folded.

According to the exemplary embodiments, the first adhesive member 100 is designed to have the thickness exceeding about 20% of the maximum thickness of the thicknesses of the adhesive members disposed between the electronic panel EP and the window member WM, and the second adhesive member 200 is designed to have the thickness smaller than about 125 micrometers (μm). Accordingly, the folding characteristics of the electronic apparatus EA10 may be improved. According to the exemplary embodiments, the electronic apparatus may have the improved reliability even though the electronic apparatus is folded at the minute curvature radius.

In the exemplary embodiment, the limitation on the extent of the thicknesses of the first adhesive member 100 and the second adhesive member 200 may be changed depending on the modulus of the window member WM. This will be described in detail with reference to Table 2.

TABLE 2

| Embodiment | 7 | 8 | 9 |
|---|---|---|---|
| ADL3(μm) | 100 | 100 | 100 |
| ADL2(μm) | 100 | 100 | 100 |
| ADL1(μm) | 63 | 65 | 69 |
| Max. (μm) | 100 | 100 | 100 |
| ADL1/Max.(%) | 63 | 65 | 69 |
| Whether defect occurs | X | ○ | ○ |

Table 2 shows whether the defect occurs in seventh to ninth empirical embodiments in which the window member WM has the modulus smaller than about 10 GPa. In the seventh to ninth embodiments, the window member WM is provided as a flexible film including a resin. Referring to Table 2, each of the thicknesses ADL2 and ADL3 of the second and third adhesive members is maintained at about 100 micrometers (μm), and the thickness ADL1 of the first adhesive member is changed to allow the percentage of the thickness ADL1 of the first adhesive member to the maximum thickness value and the maximum thickness to be different.

In the seventh to ninth embodiments, the percentage of the thickness ADL1 of the first adhesive member to the maximum thickness is determined to about 63%, about 65%, and about 69%, which exceed about 20%. Accordingly, it may be determined that a condition for the thickness of the adhesive members between the window member WM and the electronic panel EP is met. In other words, in the seventh to ninth embodiments, the thickness of the first adhesive member (e.g., ADL1) exceeds about 20% of a thickness of an adhesive member having a maximum thickness (e.g., 100 micrometers) of the plurality of adhesive members, and the thickness of the second adhesive member (e.g., ADL2) is smaller than about 125 micrometers.

As represented by the seventh embodiment, in the case that the electronic apparatus includes the first adhesive member 100 having the thickness of about 63 micrometers (μm) smaller than about 65 micrometers (μm), the defect does not occur. Different from the seventh embodiment, as represented by the eighth and ninth embodiments, in the case that the electronic apparatus includes the first adhesive member 100 having the thickness of about 65 micrometers (μm) and about 69 micrometers (μm), which are equal to or greater than about 65 micrometers (μm), the defect occurs.

That is, when the window member WM has the relatively lower modulus, e.g., the modulus equal to or smaller than about 10 GPa, the thickness ADL1 of the first adhesive member is required to be smaller than about 65 micrometers (μm), and thus the reliability of the electronic apparatus may be improved. That is, in the case that the window member WM has the modulus equal to or smaller than about 10 GPa, e.g., in the case that the window member WM is the flexible film including the resin, a stress balance between upper and lower portions of the first optical member PF may be stable by controlling the thickness range of the first adhesive member 100 disposed on the opposite side of the window member WM with respect to the first optical member PF to be relatively higher as the modulus of the window member WM decreases. Therefore, the reliability of the electronic apparatus may be improved when the electronic apparatus is folded.

In case that the window member WM has the modulus from about 60 GPa to about 75 GPa, e.g., in case that the window member WM is a glass substrate, the thickness ADL1 of the first adhesive member may not be limited. When the window member WM has a high modulus, the impact resistance of the electronic apparatus may be easily secured even though the first adhesive member 100 has a small thickness. In addition, although the first adhesive member 100 has a large thickness, a compressive stress and a tensile stress may be stably balanced. It is advantageous for the window member WM to have a thickness smaller than about 100 micrometers (μm) such that the window member WM may secure the flexibility to maintain the folding characteristics of the electronic apparatus. According to the exemplary embodiments, the reliability of the electronic apparatus against the folding stress may be easily secured by adjusting the thickness of the adhesive members of the electronic apparatus. In addition, although the modulus of the window member WM has various values, the reliability of the electronic apparatus may be stably secured by adjusting the thickness of the adhesive members in various embodiments.

Figure 6A:
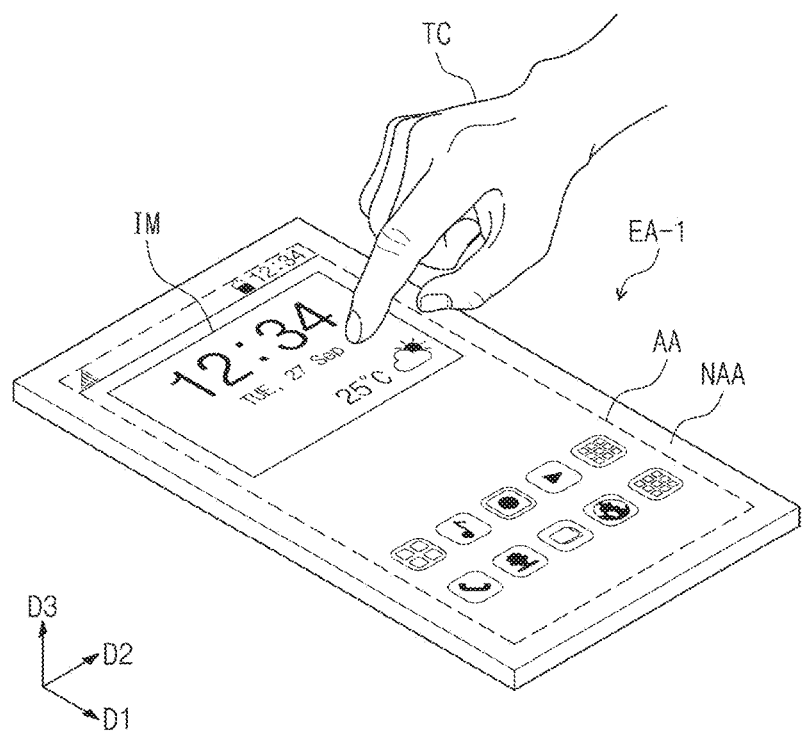
FIG. 6A is a perspective view of an electronic apparatus constructed according to an exemplary embodiment.
Figure 6B:
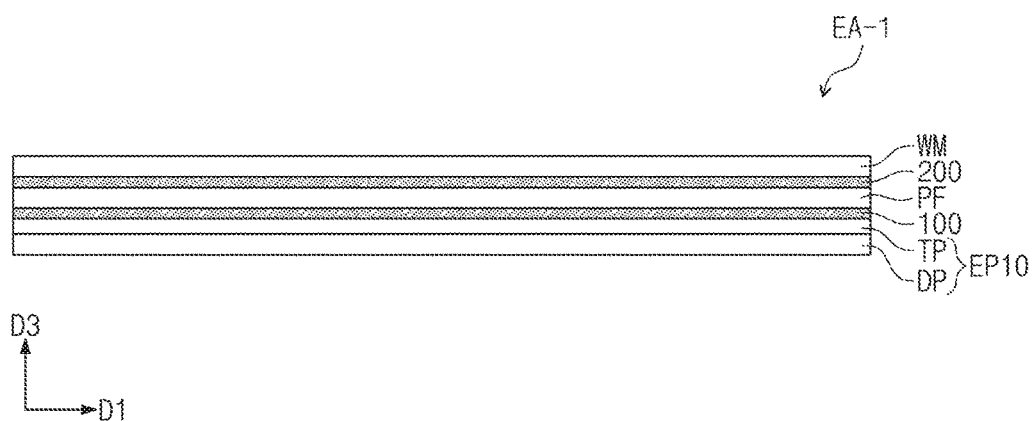
FIG. 6B is a cross-sectional view of the electronic apparatus shown in FIG. 6A.

FIG. 6A is a perspective view of an electronic apparatus EA-1 constructed according to an exemplary embodiment. FIG. 6B is a cross-sectional view of the electronic apparatus shown in FIG. 6A.

The electronic apparatus EA-1 shown in FIGS. 6A and 6B includes components corresponding to those of the electronic apparatus EA shown in FIG. 2A except for an electronic panel EP10. In FIGS. 6A and 6B, the same reference numerals denote the same element in FIGS. 1A to 5C, and thus detailed descriptions of the same elements will be omitted to avoid redundancy.

Referring to FIG. 6A, the electronic apparatus EA-1 may sense an external input TC applied thereto. Accordingly, the electronic apparatus EA-1 may serve as an output apparatus displaying the image IM and an input apparatus receiving the external input TC.

The external input TC is provided by a user's finger, but the external input TC may be provided in various ways. For instance, the external input TC may be provided in various ways, such as force, pressure, light, etc., as well as a touch generated when a part of a user's body such as a user's hand touches or is adjacent to the electronic apparatus EA-1 and should not be limited to a specific example.

Referring to FIG. 6B, the electronic panel EP10 may include a display panel DP and a sensing panel TP. The display panel DP generates and displays the image IM. The display panel DP may substantially correspond to the electronic panel EP shown in FIG. 3B. Hereinafter, details on the same elements will be omitted in order to avoid redundancy. The sensing panel TP may include a sensor to sense the external input TC. The sensor may include a plurality of conductive patterns. The external input TC may cause a change in a capacitance between the conductive patterns or form a capacitance with the conductive patterns. As another way, the external input TC may cause a change in a resistance of the conductive patterns. The sensing panel TP may obtain information about a position and an intensity of the external input TC from the change in the capacitance or resistance of the sensor.

The sensing panel TP may be directly formed on the display panel DP. For example, the sensing panel TP may be directly formed on the encapsulation layer EC (refer to FIG. 3B) of the electronic panel EP. Accordingly, the adhesive member may be omitted between the sensing panel TP and the display panel DP.

Among components of the electronic panel EP10, a component making contact with the first adhesive member 100 may be the sensing panel TP, however, the sensing panel TP may be provided inside the display panel DP or disposed under the display panel DP. In this case, the component making contact with the first adhesive member 100 among the components of the electronic panel EP10 may be the display panel DP.

According to the exemplary embodiments, although the electronic panel EP10 includes various components, the foldable electronic apparatus may be stably implemented by controlling the thickness of the first adhesive member 100 and the thickness of the second adhesive member 200.

Figure 7A:
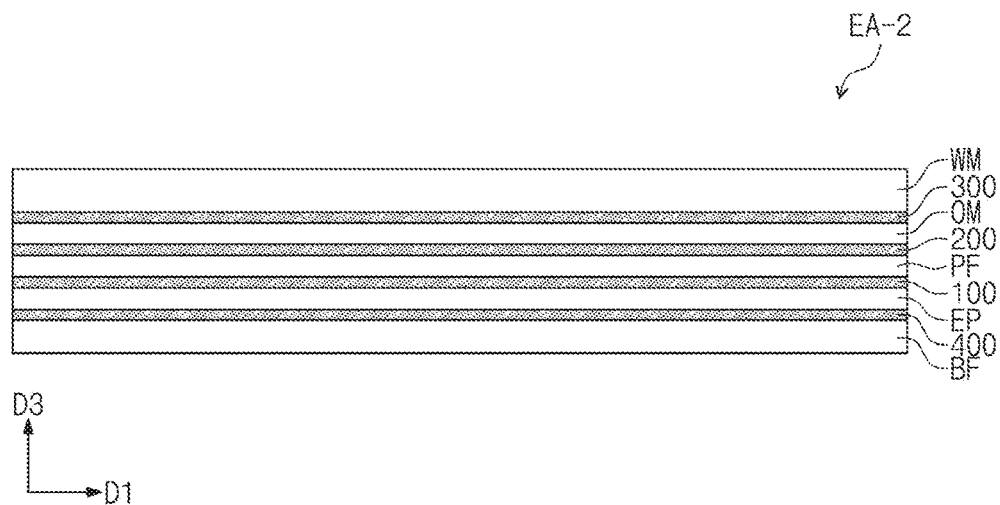
FIGS. 7A and 7B are cross-sectional views of still another exemplary embodiment of an electronic apparatus constructed according to the principles of the invention.
Figure 7B:
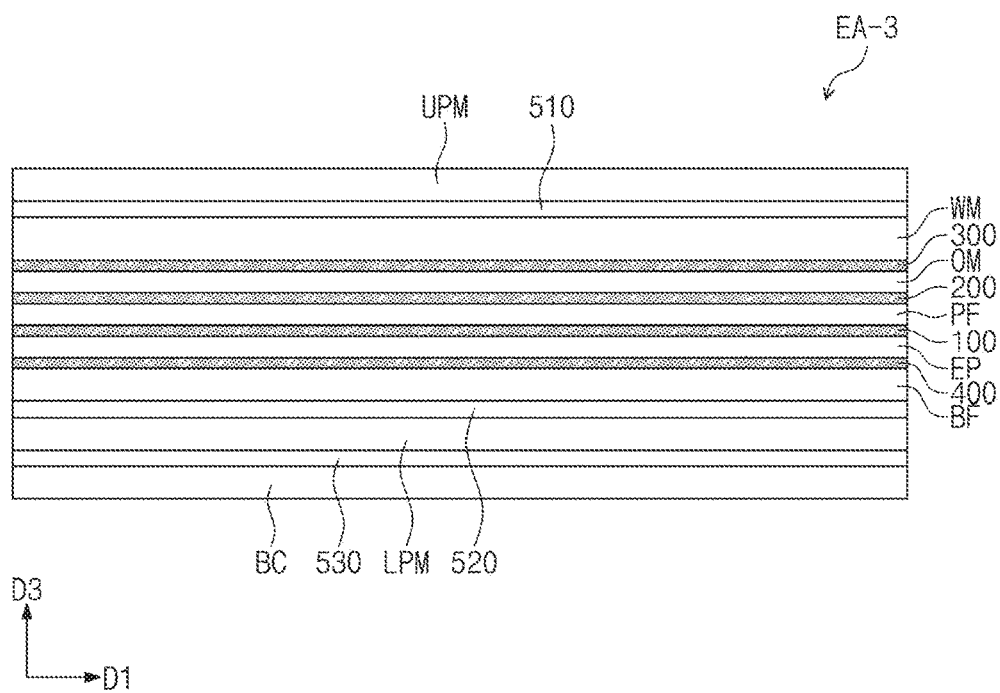

FIGS. 7A and 7B are cross-sectional views of still another exemplary embodiment of an electronic apparatus constructed according to the principles of the invention. In FIGS. 7A and 7B, the same reference numerals denote the same elements in FIGS. 1A to 6B, and thus detailed descriptions of the same elements will be omitted to avoid redundancy.

Referring to FIG. 7A, the electronic apparatus EA-2 may further include a lower adhesive member 400 and a base film BF. The electronic apparatus EA-2 may have the same configuration as that of the electronic apparatus EA10 shown in FIG. 4 except for the lower adhesive member 400 and the base film BF, and details on the same elements will be omitted in order to avoid redundancy.

The base film BF may be disposed under the electronic panel EP. The base film BF may support the electronic panel EP and protect a lower portion of the electronic panel EP. The base film BF may be flexible and include an insulating material. As an example, the base film BF may include a resin such as polyimide.

The lower adhesive member 400 is disposed between the electronic panel EP and the base film BF to physically couple the electronic panel EP to the base film BF. The lower adhesive member 400 is not included in the adhesive members disposed between the electronic panel EP and the window member WM. Accordingly, an influence exerting on elements controlling the thickness of the first adhesive member 100 by the thickness of the lower adhesive member 400 may decrease.

Referring to FIG. 7B, the electronic apparatus EA-3 may include a lower protection member LPM, an upper protection member UPM, a cover member BC, and a plurality of additional adhesive members 510, 520, and 530. The electronic apparatus EA-3 may have the same configuration as that of the electronic apparatus EA-2 shown in FIG. 7A except for the lower protection member LPM, the upper protection member UPM, the cover member BC, and the additional adhesive members 510, 520, and 530, and details on the same elements will be omitted in order to avoid redundancy.

The upper protection member UPM is disposed above the window member WM to protect the window member WM. Among the additional adhesive members 510, 520, and 530, a first additional adhesive member 510 is disposed between the upper protection member UPM and the window member WM. The first additional adhesive member 510 physically couples the window member WM to the upper protection member UPM.

The upper protection member UPM may be optically transparent. In addition, the upper protection member UPM may be flexible. The upper protection member UPM may include a film including resin or a thin film glass. Meanwhile, the upper protection member UPM may be directly formed on the window member WM. The upper protection member UPM may be a coating layer coated on an upper surface of the window member WM. In this case, the first additional adhesive member 510 may be omitted.

The lower protection member LPM is disposed under the electronic panel EP (or under the base film BF) to protect the electronic panel EP. Among the additional adhesive members 510, 520, and 530, a second additional adhesive member 520 is disposed between the lower protection member LPM and the base film BF. The second additional adhesive member 520 physically couples the lower protection member LPM to the base film BF. The lower protection member LPM may be flexible. In addition, the lower protection member LPM may have a predetermined rigidity. Accordingly, the impact resistance of the electronic apparatus EA-3 may be improved.

The cover member BC may be disposed under the lower protection member LPM. The cover member BC stably protects the electronic panel EP to improve the impact resistance of the electronic apparatus EA-3. Among the additional adhesive members 510, 520, and 530, a third additional adhesive member 530 is disposed between the cover member BC and the lower protection member LPM. The third additional adhesive member 530 physically couples the cover member BC to the lower protection member LPM.

The additional adhesive members 510, 520, and 530 are not included in the adhesive members disposed between the electronic panel EP and the window member WM. Accordingly, although the electronic apparatuses EA-2 and EA-3 include the additional components disposed above the window member WM or under the electronic panel EP, the thickness of the first adhesive member 100 may be controlled without taking into account thicknesses of the additional adhesive members 510, 520, and 530. Accordingly, the electronic apparatuses EA-2 and EA-3 with improved reliability against the folding stress may be provided.

According to the principles and exemplary embodiments of the invention, the adhesive members of the electronic apparatus are designed to have the thickness within predetermined ranges, and thus the electronic apparatus may have a stack structure with a sufficient balance of flexibility and rigidity. Accordingly, the stress caused by folding the electronic apparatus may be relieved, and the impact resistance of the electronic apparatus may be improved.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An electronic apparatus comprising:
a display panel having a display element and being configured to be folded or unfolded about a folding axis extending in a first direction;
a window member disposed on the display panel and configured to be folded or unfolded about the folding axis;
a first optical member disposed between the display panel and the window member; and
a plurality of adhesive members disposed between the display panel and the window member, the adhesive members including:
a first adhesive member disposed on a surface of the display panel and having a first thickness; and
a second adhesive member disposed on a surface of the first optical member and having a second thickness,
wherein the first thickness exceeds about 20% of a thickness of an adhesive member having a maximum thickness of the plurality of adhesive members, and the second thickness is smaller than about 125 micrometers.

2. The electronic apparatus of claim 1, wherein the window member comprises a glass substrate.

3. The electronic apparatus of claim 2, wherein the window member has a thickness smaller than about 100 micrometers.

4. The electronic apparatus of claim 1, wherein the window member comprises a resin film.

5. The electronic apparatus of claim 4, wherein the first thickness is smaller than about 65 micrometers.

6. The electronic apparatus of claim 1, wherein the first adhesive member is disposed between the display panel and the first optical member and is attached to each of the display panel and the first optical member, and the second adhesive member is attached to an upper surface of the first optical member.

7. The electronic apparatus of claim 1, further comprising a second optical member disposed between the first optical member and the window member,
wherein the plurality of the adhesive members further comprise a third adhesive member disposed between the second optical member and the window member, and
wherein the first optical member comprises a polarization film.

8. The electronic apparatus of claim 1, wherein the window member is closer to the folding axis than the display panel is to enable the apparatus to be inwardly folded.

9. The electronic apparatus of claim 1, further comprising:
a base member disposed under the display panel; and
a lower adhesive member disposed between the base member and the display panel,
wherein the base member comprises an organic material.

10. The electronic apparatus of claim 9, further comprising:
a lower protection member disposed under the base member; and
an upper protection member disposed on the window member.

11. The electronic apparatus of claim 10, wherein the upper protection member directly contacts the window member.

12. The electronic apparatus of claim 10, further comprising an upper adhesive member disposed between the upper protection member and the window member,
wherein the upper adhesive member directly makes contact with the upper protection member and the window member.

13. The electronic apparatus of claim 1, wherein the display panel further comprises a touch sensor disposed on the display element to sense an external input, and
wherein the first adhesive member is disposed on the touch sensor.

14. An electronic apparatus comprising:
a window member configured to be folded or unfolded about a folding axis extending in a first direction;
a display panel configured to be folded or unfolded about the folding axis and to display an image through the window member;
a first optical member disposed between the display panel and the window member; and
a plurality of adhesive members disposed between the display panel and the window member, the adhesive members comprising:
a first adhesive member disposed between the display panel and the first optical member and attached to the first optical member; and
a second adhesive member disposed between the first optical member and the window member and attached to the first optical member,
wherein the first adhesive member has a thickness exceeding about 20% of a thickness of an adhesive member having a maximum thickness of the plurality of adhesive members, and the second adhesive member has a thickness smaller than about 125 micrometers.

15. The electronic apparatus of claim 14, wherein the first optical member comprises at least one of an optical member, a light compensation film, and a phase difference film.

16. The electronic apparatus of claim 15, wherein the first optical member comprises a plurality of layers, and a layer making contact with the first adhesive member is different from a layer making contact with the second adhesive member.

17. The electronic apparatus of claim 15, wherein the first optical member comprises a transparent plate, the first adhesive member makes contact with a lower surface of the transparent plate, and the second adhesive member makes contact with an upper surface of the transparent plate.

18. The electronic apparatus of claim 14, wherein the window member is relatively closer to the folding axis than the display panel is to enable the apparatus to be inwardly folded.

19. The electronic apparatus of claim 14, wherein the window member has a modulus from about 60 GPa to about 75 GPa and a thickness smaller than about 100 micrometers.

20. The electronic apparatus of claim 14, further comprising a second optical member disposed between the first optical member and the window member, and
wherein the plurality of adhesive members further comprise a third adhesive member disposed between the second optical member and the window member, and the maximum thickness of the plurality of adhesive members corresponds to a maximum value of thicknesses of the first, second, and third adhesive members.

* * * * *